United States Patent
Park et al.

(10) Patent No.: US 6,879,223 B2
(45) Date of Patent: Apr. 12, 2005

(54) DISTRIBUTED CONSTANT TYPE FILTER

(75) Inventors: Jin Chae Park, Daejeon (KR); Dong Chan Woo, Daegu (KR); Chung Kook Lee, Daejeon (KR); Seong Yong Hong, Daejeon (KR); Ki Jung Lee, Daejeon (KR)

(73) Assignee: Lattron Co., Ltd., Daejeon (KR)

( * ) Notice: Subject to any disclaimer, the term of this patent is extended or adjusted under 35 U.S.C. 154(b) by 112 days.

(21) Appl. No.: 10/602,163

(22) Filed: Jun. 24, 2003

(65) Prior Publication Data

US 2004/0000969 A1 Jan. 1, 2004

(30) Foreign Application Priority Data

Jun. 27, 2002 (KR) ................................. 10-2002-0036443

(51) Int. Cl.[7] .............................................. H03H 7/00
(52) U.S. Cl. ....................... 333/185; 333/202; 333/204
(58) Field of Search .............................. 333/170, 175, 333/185, 202–205, 219

(56) References Cited

U.S. PATENT DOCUMENTS 6,170,154 B1 * 1/2001 Swarup ........................ 29/830
6,191,666 B1 * 2/2001 Sheen ......................... 333/185
6,643,924 B1 * 11/2003 Hirabayashi ................. 29/846
6,713,162 B1 * 3/2004 Takaya et al. ............... 428/209

* cited by examiner

Primary Examiner—Don Le
(74) Attorney, Agent, or Firm—Frommer Lawrence & Haug LLP; Ronald R. Santucci

(57) ABSTRACT

Provided is a distributed constant type filter. In a stacked body formed by stacking a plurality of printed circuit boards, signal line coil patterns on adjacent printed circuit boards face each another and are electrically connected together at both ends, and ground line coil patterns on adjacent printed circuit boards face each other and are electrically connected together at both ends. Accordingly, the distributed constant type filter has an attenuation characteristic superior to conventional distributed constant type filters while having an equivalent circuit completely different to the conventional distributed constant type filters. In addition, attenuation characteristics can be obtained without being greatly affected by a deviation upon a manufacturing process, and a process of manufacturing the filter is simple.

3 Claims, 11 Drawing Sheets

DISTRIBUTED CONSTANT TYPE FILTER

BACKGROUND OF THE INVENTION

This application claims the priority of Korean Patent Application No. 2002-36443, filed on Jun. 27, 2002, in the Korean Intellectual Property Office, the disclosure of which is incorporated herein in its entirety by reference.

1. Field of the Invention

The present invention relates to a distributed constant type filter, and more particularly, to a distributed constant type filter having printed circuit boards to remove an electromagnetic wave obstacle.

2. Description of the Related Art

Conventional distributed constant type filters are made up of two facing coils and a parasitic capacitance (C) generated on the area where the two coils overlap. To be more specific, where inductor components adjoin each other in parallel, one coil is used as an inductor electrode, and the other coil is used as a ground electrode. An LC filter is formed by capacitance (C) generated on the area where the two coils overlap. This LC filter forming method is used to manufacture conventional distributed constant type filters.

FIG. 1 shows an equivalent circuit of a conventional distributed constant type filter. Representative conventional distributed constant type noise filters are disclosed in Japanese Patent Publication Nos. hei 8-18377 and hei 8-45745, which are shown in FIGS. 2 and 3, respectively.

The pattern of conventional distributed constant type filters can vary, but the conventional distributed constant type filters with different patterns have a common thing. In other words, all of them have an equivalent circuit of FIG. 1. Referring to FIGS. 2 and 3, the conventional distributed constant type filters disclosed in Japanese Patent Publication Nos. hei 8-18377 and hei 8-45745 have different shapes of patterns but both have the equivalent circuit of FIG. 1.

Referring to FIG. 1, one coil goes into an IN terminal and comes out of an OUT terminal, and another coil, which is under the coil, enters a GROUND terminal. A parasitic capacitance (C) is formed between the two coils.

Referring to FIG. 2, in an A-type pattern, a coil goes into an IN terminal and comes out of an OUT terminal. A-type patterns A1 through A6 are connected to one other to form one coil. B-type patterns B1 through B6 are connected to one other and form a coil that enters a GROUND terminal. The parasitic capacitance (C) of FIG. 1 is generated on the area where the two coils overlap.

A conventional distributed constant type filter of FIG. 3 also has the same structure as shown in FIG. 2. In an A-type pattern, a coil goes into an IN terminal and comes out of an OUT terminal. A-type patterns A1 through A12 are connected to each other to form one coil. B-type patterns B1 through B12 are connected to each other and form a coil that enters a GROUND terminal. The parasitic capacitance (C) of FIG. 1 is generated on the area where the two coils overlap.

To sum up, conventional distributed constant type filters have different patterns in detail but have an identical basic structure. Conventional distributed constant type filters having such an equivalent circuit as shown in FIG. 1 have the following two drawbacks.

Firstly, the inductance (L) values of the two coils and the capacitance (C) value between the two coils must be accurately adjusted to obtain an excellent attenuation curve, but there is a high possibility that a filter with bad attenuation characteristics is manufactured due to a deviation occurring upon a manufacturing process.

Secondly, it is difficult to precisely adjust the L values of the two coils and the C value between the two coils in order to design a filter having different attenuation frequency bands.

SUMMARY OF THE INVENTION

The present invention provides a distributed constant type filter having attenuation characteristics superior to conventional filters while having an equivalent structure completely different to conventional distributed constant type filters.

The present invention also provides a distributed constant type filter whose attenuation characteristics can be implemented without being greatly affected by a deviation occurring upon a manufacturing process.

The present invention also provides a distributed constant type filter capable of being easily designed to have different attenuation frequency bands.

According to an aspect of the present invention, there is provided a distributed constant type filter in which, in a stacked body formed by stacking a plurality of printed circuit boards, signal line coil patterns on adjacent printed circuit boards face each another and are electrically connected together at both ends, and ground line coil patterns on adjacent printed circuit boards face each other and are electrically connected together at both ends.

Preferably, the signal line coil patterns are connected to one another through via-hole conductors formed at both ends of the signal line coil patterns, and the ground line coil patterns are connected to one another through via-hole conductors formed at both ends of the ground line coil patterns.

It is also preferable that one end of each of the signal line coil pattern and the ground line coil pattern on the top and bottom printed circuit boards, respectively, extends up to the edge of each of the top and bottom printed circuit boards and is connected to an external electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 4:
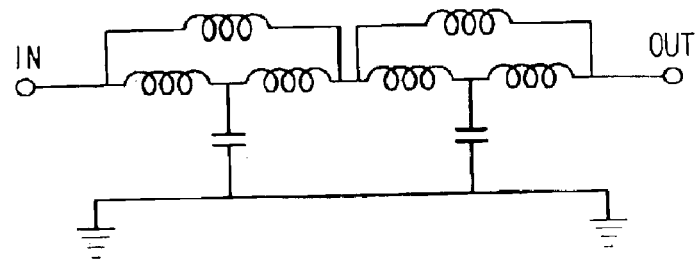
FIG. 4 shows an equivalent circuit of a distributed constant type filter according to the present invention.
Figure 5:
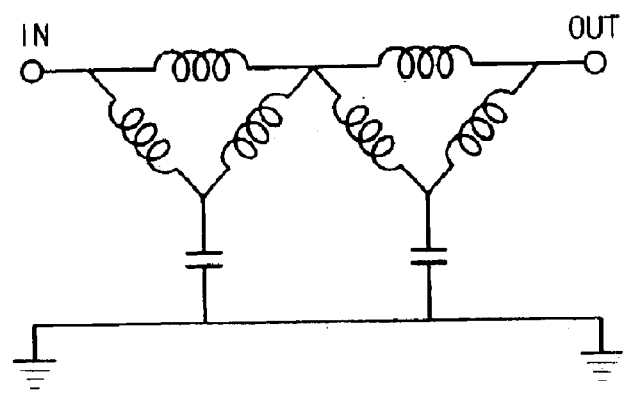
FIG. 5 shows an equivalent circuit in a Δ (delta) shape, into which the equivalent circuit of FIG. 4 is transformed.
Figure 6:
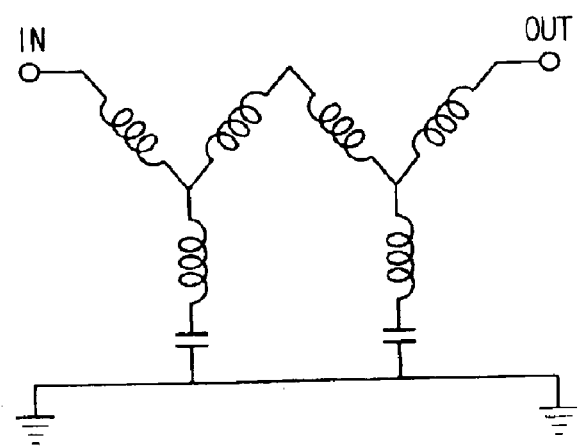
FIG. 6 shows an equivalent circuit formed by transforming the inductors of FIG. 5 using a Y-Δ (delta) transformation method, which is used in a circuit theory.
Figure 7:
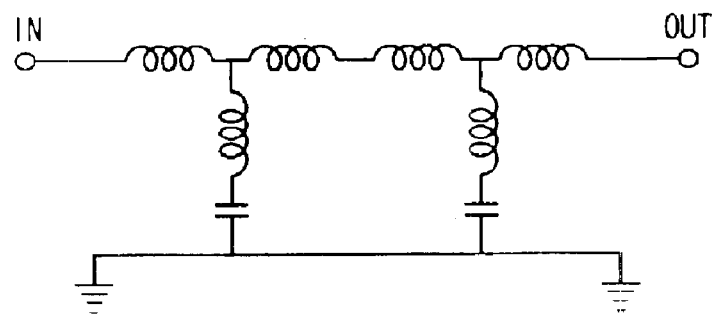
FIG. 7 shows an equivalent circuit obtained by rearranging the equivalent circuit of FIG. 6.

FIG. 4 shows an equivalent circuit of a distributed constant type filter according to the present invention. The shape of the equivalent circuit of FIG. 4 is transformed into a Δ (delta) shape, thereby forming an equivalent circuit of FIG. 5. When the inductors of FIG. 5 are transformed using a Y–Δ (delta) transformation method used in a circuit theory, an equivalent circuit of FIG. 6 can be obtained. A low-pass filter having a notch as shown in FIG. 7 is obtained by rearranging the equivalent circuit of FIG. 6. In other words, it can be known that a distributed constant type filter according to the present invention has such an equivalent circuit as shown in FIG. 7.

Figure 1:
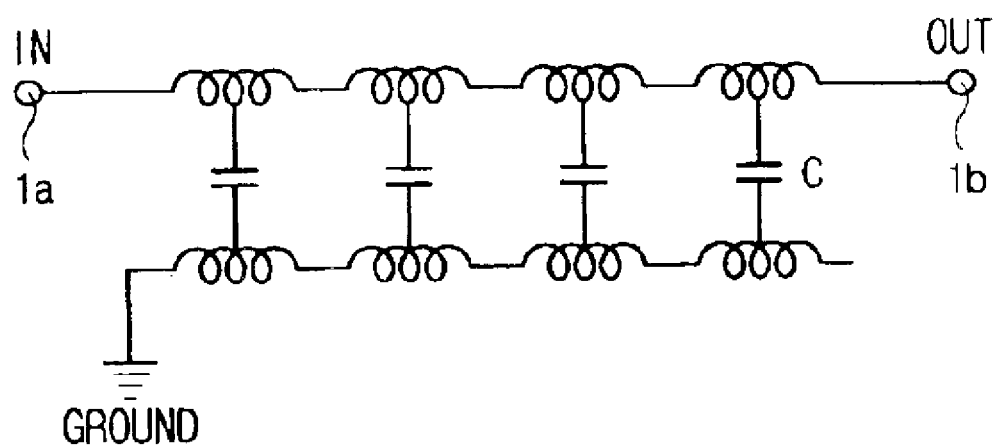
FIG. 1 shows an equivalent circuit of a conventional distributed constant type filter.

The reasons why the equivalent circuit according to the present invention of FIG. 7 is superior to a conventional equivalent circuit as shown in FIG. 1 will now be described.

Figure 8:
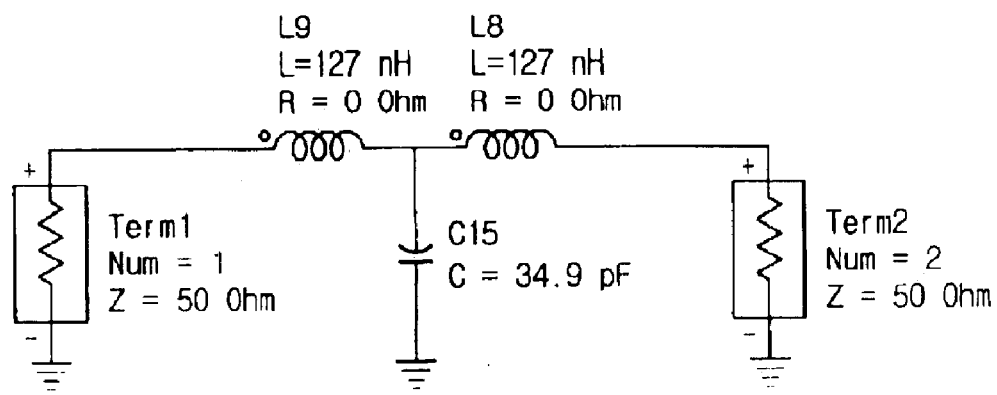
FIG. 8 is a circuit diagram of a Chebyshev 3-stage filter with a cut-off frequency of 100 MHz, the Chebyshev 3-stage filter having such a structure as in FIG. 1.
Figure 9:
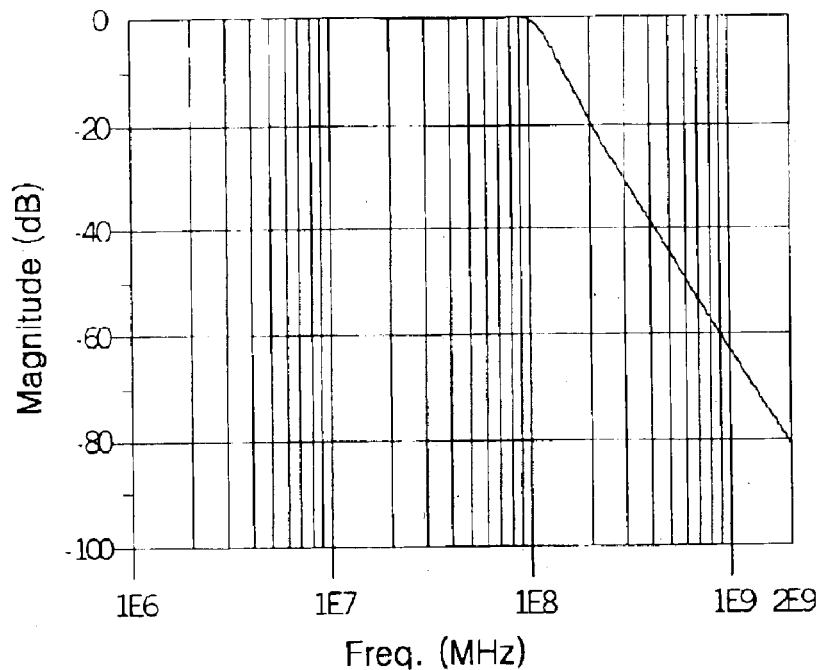
FIG. 9 shows the results of a circuit simulation performed on the Chebyshev 3-stage filter of FIG. 8.
Figure 10:
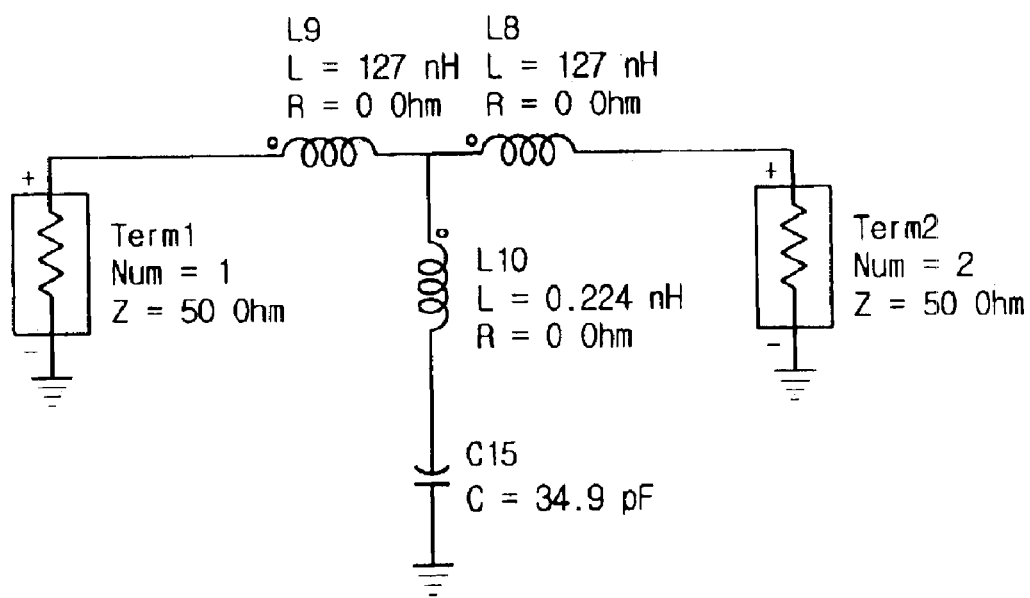
FIG. 10 is a circuit diagram of a circuit according to the present invention, obtained by inserting a notch into the Chebyshev 3-stage filter of FIG. 8 at 1800 MHz.
Figure 11:
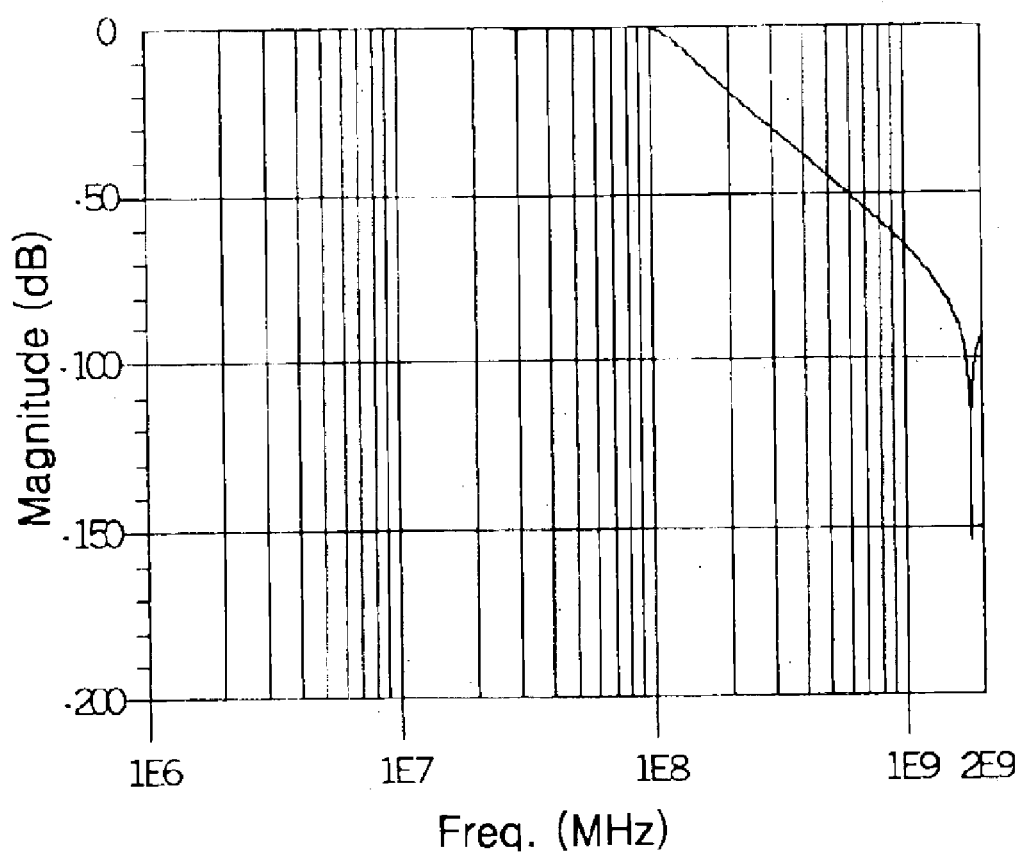
FIG. 11 shows the results of a circuit simulation performed on the circuit of FIG. 10.

FIG. 8 is a circuit diagram of a Chebyshev 3-stage filter with a cut-off frequency of 100 MHz, the filter having a conventional circuit structure as shown in FIG. 1. FIG. 9 shows the results of a circuit simulation performed on the Chebyshev 3-stage filter of FIG. 8. FIG. 10 is a circuit diagram of a circuit obtained by inserting a notch into the conventional circuit of FIG. 8 at 1800 MHz. The circuit of FIG. 10 is a circuit having the same structure as shown in FIG. 7. FIG. 11 shows the results of a circuit simulation performed on the circuit of FIG. 10. It can be seen that the attenuation characteristic of the circuit according to the present invention shown in FIG. 11 is far superior to that of a conventional circuit shown in FIG. 9.

To obtain a distributed constant type filter having such an equivalent circuit according to the present invention, a conventional internal pattern structure in which two coils are overlapped must be changed to a structure in which links are overlapped.

Figure 2:
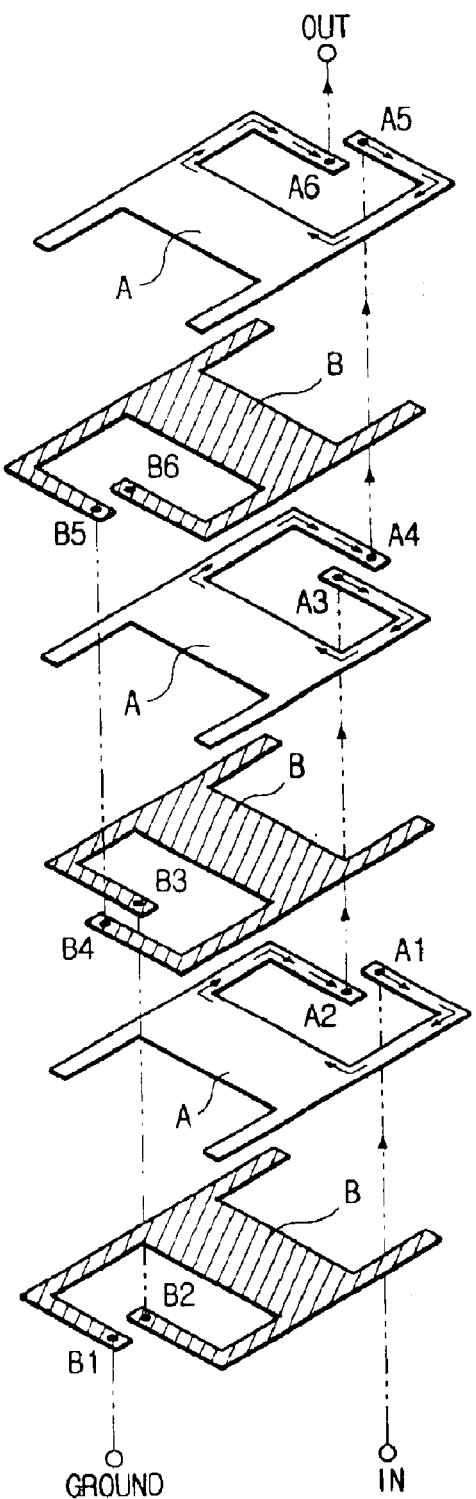
FIGS. 2 and 3 are schematic diagrams of two types of conductor patterns of conventional distributed constant type filters.
Figure 3:
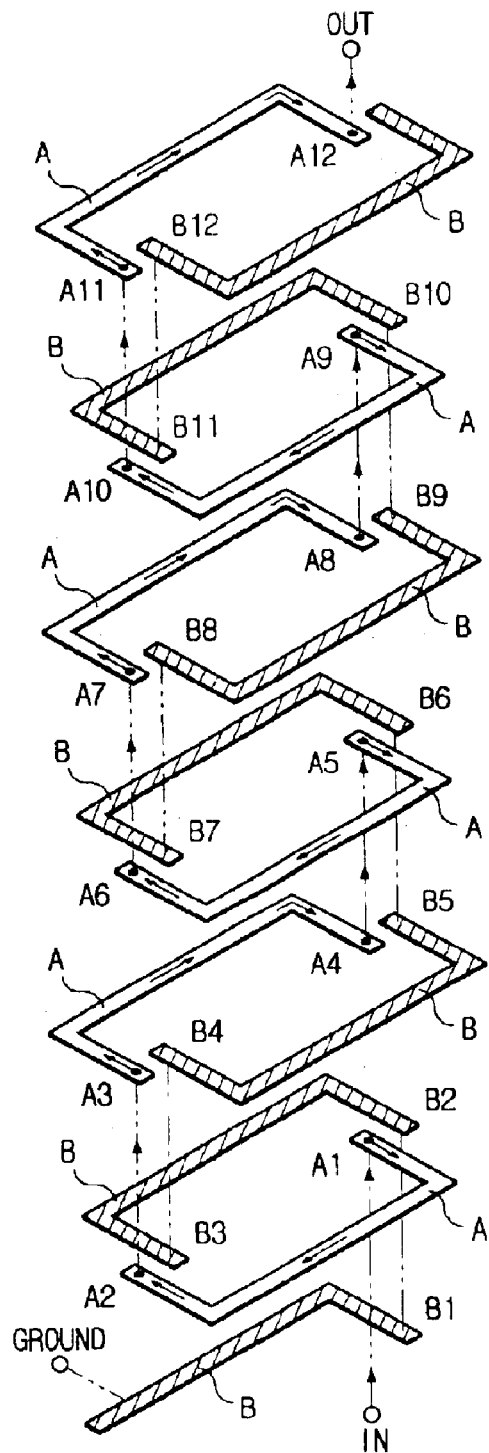

The conventional distributed constant type filters of FIGS. 2 and 3 have the conventional circuit structure in which two coils are overlapped. To obtain the structure where adjacent links are overlapped, via-holes must be formed to connect all of printed circuit boards to one another. In other words, all of the via-holes must be connected to one another so as to be penetrated by a conductor. This method is applied to all cases no matter what pattern shapes are used.

Figure 12:
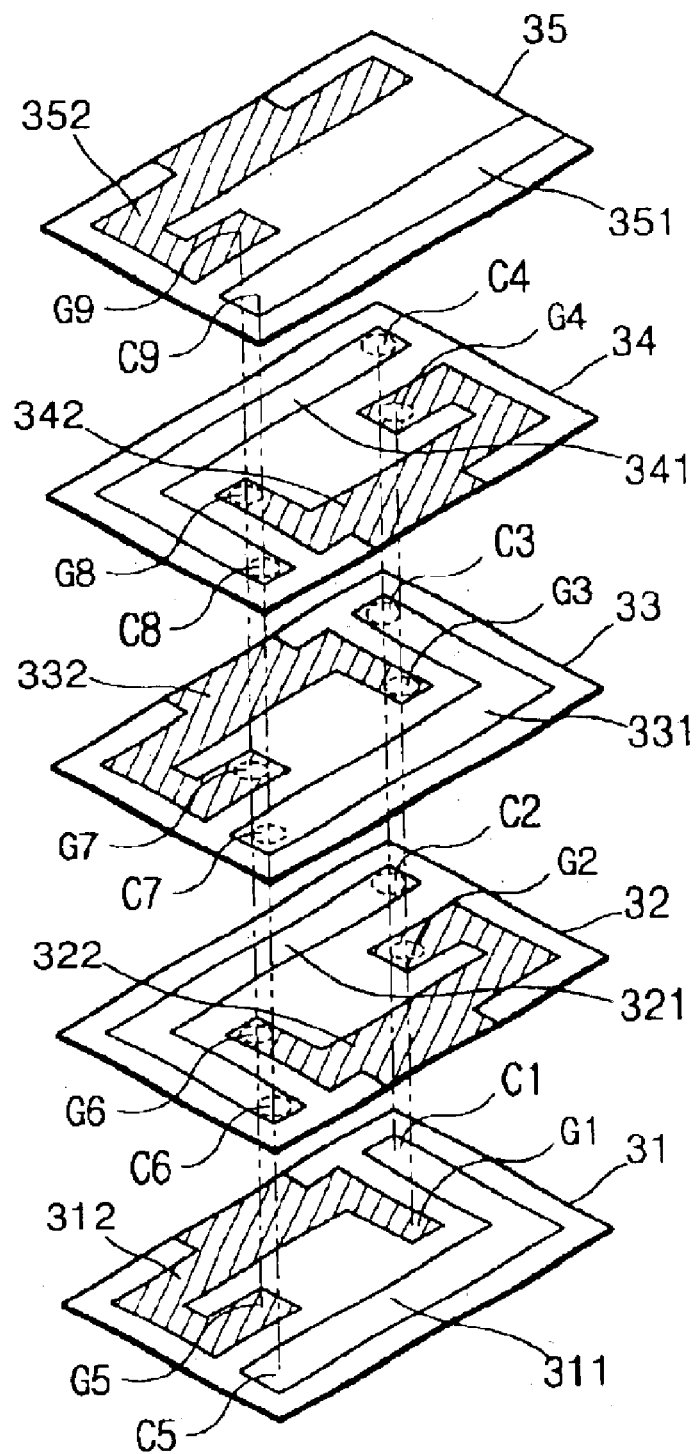
FIG. 12 is a schematic view showing a conductor pattern of a distributed constant type filter according to an embodiment of the present invention.

FIG. 12 is a schematic view of a conductor pattern of a distributed constant type filter according to an embodiment of the present invention. Printed circuit boards 31, 32, 33, 34, and 35 include signal line coil patterns 311, 321, 331, 341, and 351, respectively, and ground line coil patterns 312, 322, 332, 342, and 352, respectively. The signal line coil patterns 311, 321, 331, 341, and 351 are arranged in such a way that adjacent patterns face each other, and likewise for the ground line coil patterns 312, 322, 332, 342, and 352. The shapes and configurations of the signal line coil patterns and the ground line coil patterns may be changed to any shapes and configurations as long as they have the characteristics of the present invention.

The signal line coil patterns 311, 321, 331, 341, and 351 are connected to each other through via-hole conductors C1, C2, C3, C4, and C5. The ground line coil patterns 312, 322, 332, 342, and 352 are connected to each other through via-hole conductors G1, G2, G3, G4, and G5.

Although not shown in FIG. 12, external electrodes are connected to the signal line coil pattern 351 and the ground line coil pattern 352, respectively, on the top printed circuit board 35, and external electrodes are connected to the signal line coil pattern 311 and the ground line coil pattern 312, respectively, on the bottom printed circuit board 31. Besides, although not shown in FIG. 12, protective layers having no coil patterns may be deposited on the top surface of the top printed circuit board 35 and on the bottom surface of the bottom printed circuit board 31.

To be more specific, the signal line coil patterns 311, 321, 331, 341, and 351 are connected to one another through the via-hole conductors C1 through C4 and through via-hole conductors C5 through C9 and form a body. The ground line coil patterns 312, 322, 332, 342, and 352 are connected to one another through the via-hole conductors G1 through G4 and through via-hole conductors G5 through G9 and form a body.

To obtain the conventional structure in which two coils are overlapped, the via-hole conductors C2 and C3 must not be connected to each other, and likewise between the via-hole conductors C5 and C6, between the via-hole conductors C7 and C8, between the via-hole conductors G2 and G3, between the via-hole conductors G5 and G6, and between the via-hole conductors G7 and G8. However, in the present invention, the via-hole conductors C1 through C4 are connected to one another, the via-hole conductors C5 through C9 are connected to one another, the via-hole conductors G1 through G4 are connected to one another, and the via-hole conductors G5 through G9 are connected to one another. Accordingly, as viewed from the top, it appears that four connecting pins are stuck in four holes.

Figure 13:
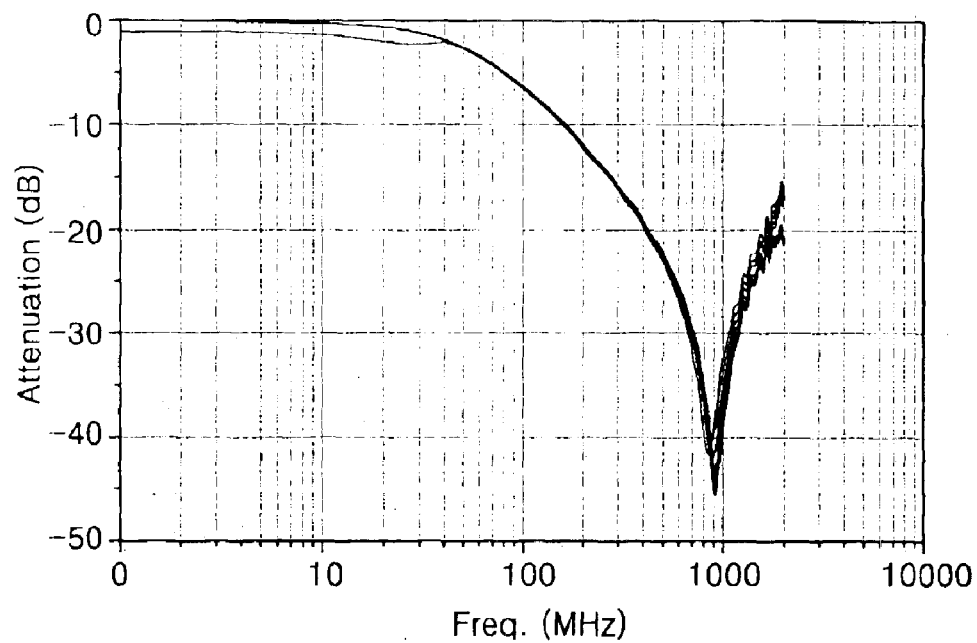
FIG. 13 shows the results of measurement on the attenuation of a distributed constant type filter having such a structure as shown in FIG. 12.

FIG. 13 shows the results of measurement on the attenuation of a distributed constant type filter having such a structure as shown in FIG. 12.

Figure 14:
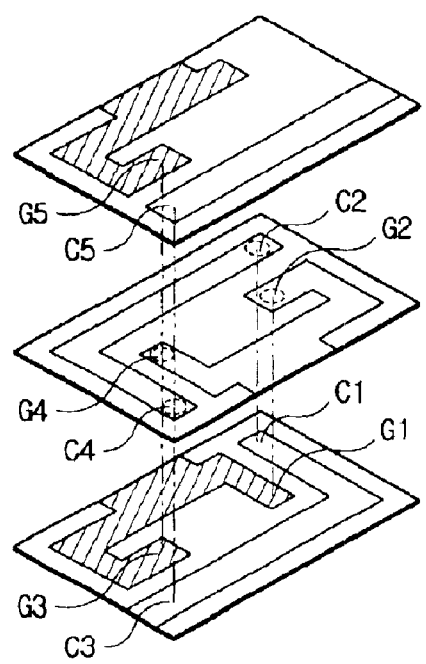
FIG. 14 is a schematic view of a conductor pattern of a distributed constant type filter according to another embodiment of the present invention.
Figure 15:
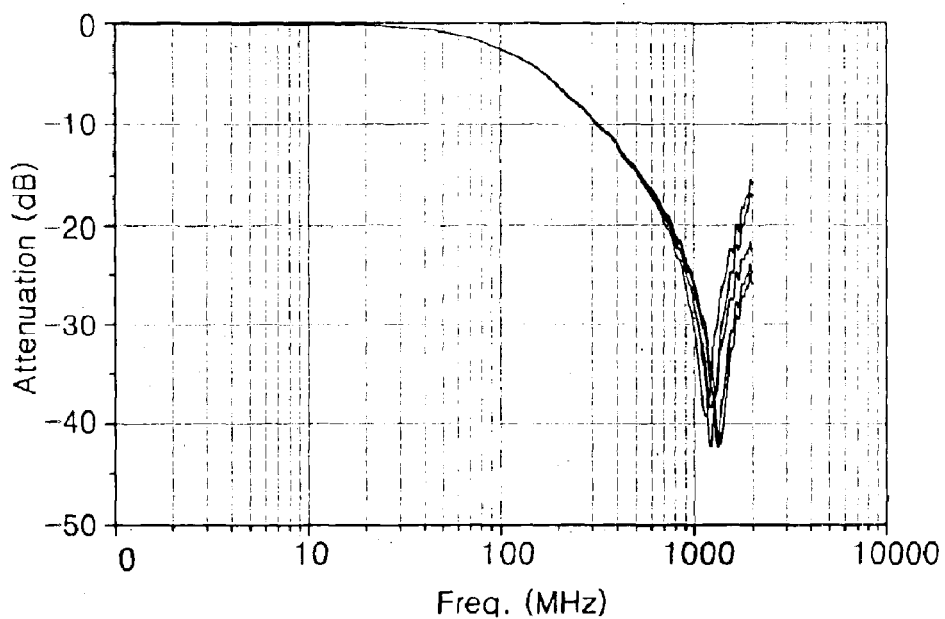
FIG. 15 shows the results of measurement on the attenuation of a distributed constant type filter having such a structure as shown in FIG. 14.
Figure 16:
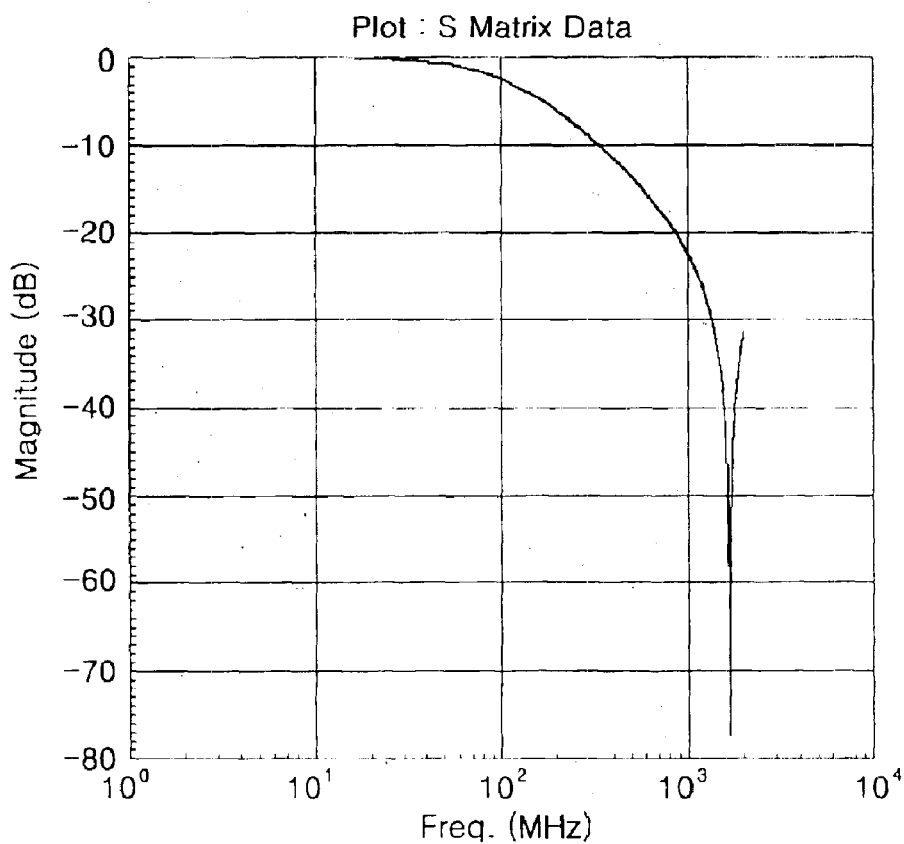
FIG. 16 shows the results of simulation performed using a high frequency structure simulator (HFSS) on a distributed constant type filter having such a structure as shown in FIG. 14.
Figure 17:
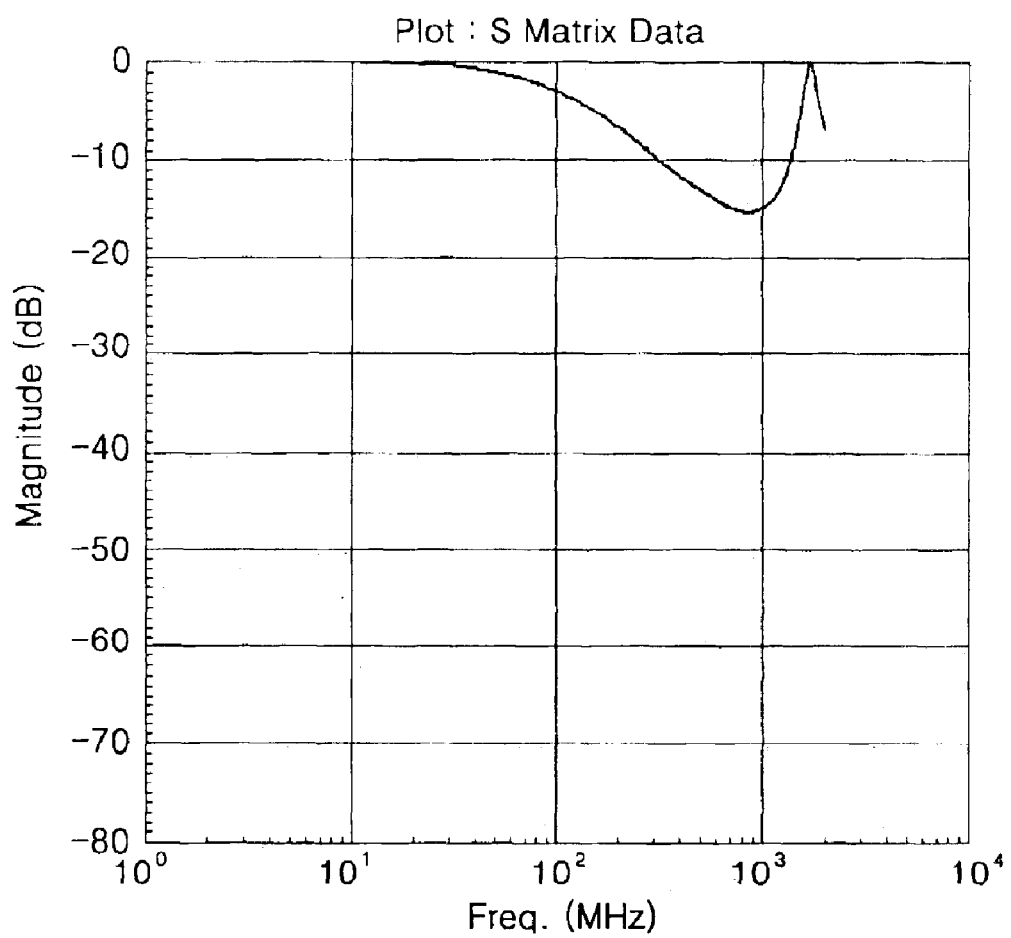
FIG. 17 shows the results of simulation performed using an HFSS on a distributed constant type filter having a conventional structure, in which sheet layers are not connected to one another through via-holes, while the conductor pattern of FIG. 14 is used.

FIG. 14 is a schematic view of a conductor pattern of a distributed constant type filter according to another embodiment of the present invention. FIG. 15 shows the results of measurement on the attenuation of a distributed constant type filter having such a structure as shown in FIG. 14. FIG. 16 shows the results of simulation performed using a HFSS on a distributed constant type filter having such a structure as shown in FIG. 14. To be compared with FIG. 16, FIG. 17 shows the results of a simulation performed using an HFSS on a filter having a conventional structure, in which printed circuit boards are not connected to one another through via-holes, while the conductor pattern of FIG. 14 is used.

It can be known from the results of measurement of FIG. 15 that a distributed constant type filter according to the present invention has a large attenuation characteristic as shown in the results of simulation of FIG. 16. It also can be known that a distributed constant type filter having such a small number of patterns as shown in FIG. 14 has a high attenuation of 40 dB or greater. In particular, it can be known that a constant attenuation curve appears in a structure having several printed circuit boards that are stacked. However, it can be known from FIG. 17 that a conventional filter has a bad attenuation characteristic. In other words, filters having a conventional equivalent circuit need precisely designed patterns in order to have an excellent attenuation characteristic.

On the other hand, a filter according to the present invention can easily have a large attenuation without need of precise pattern management, and its attenuation frequency bands can be easily designed because they are easily consistent with the results of a simulation performed on the filter according to the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

As described above, a distributed constant type filter according to the present invention has an attenuation characteristic superior to conventional distributed constant type filters while having an equivalent circuit completely different to the conventional distributed constant type filters. In addition, attenuation characteristics can be obtained without being greatly affected by a deviation upon a manufacturing process, and a filter having different attenuation frequency bands is easily designed. Also, the process of manufacturing the filters is very simple.

What is claimed is:

1. A distributed constant type filter in which, in a stacked body formed by stacking a plurality of printed circuit boards, signal line coil patterns on adjacent printed circuit boards face each another and are electrically connected together at both ends, and ground line coil patterns on adjacent printed circuit boards face each other and are electrically connected together at both ends.

2. The distributed constant type filter of claim 1, wherein the signal line coil patterns are connected to one another through via-hole conductors formed at both ends of the signal line coil patterns, and the ground line coil patterns are connected to one another through via-hole conductors formed at both ends of the ground line coil patterns.

3. The distributed constant type filter of claim 1, wherein one end of each of the signal line coil pattern and the ground line coil pattern on the top and bottom printed circuit boards, respectively, extends up to the edge of each of the top and bottom printed circuit boards and is connected to an external electrode.

* * * * *